United States Patent [19]
Antoniadis et al.

[11] Patent Number: 5,902,688
[45] Date of Patent: May 11, 1999

[54] ELECTROLUMINESCENT DISPLAY DEVICE

[75] Inventors: Homer Antoniadis, Mountain View; Steven D. Lester, Palo Alto; Jeffrey N. Miller, Los Altos Hills, all of Calif.

[73] Assignee: Hewlett-Packard Company, Palo Alto, Calif.

[21] Appl. No.: 08/687,011

[22] Filed: Jul. 16, 1996

[51] Int. Cl.$^6$ .................................................. H05B 33/00
[52] U.S. Cl. .......................... 428/690; 428/917; 303/504; 303/505; 303/506; 303/507; 303/508; 303/509; 303/510; 427/66
[58] Field of Search ................................... 428/690, 917; 313/504–510; 427/66

[56] References Cited

U.S. PATENT DOCUMENTS

| | | | |
|---|---|---|---|
| 4,356,429 | 10/1982 | Tang | 313/503 |
| 4,446,399 | 5/1984 | Endo et al. | 313/505 |
| 4,539,507 | 9/1985 | VanSlyke et al. | 313/504 |
| 4,885,211 | 12/1989 | Tang et al. | 428/457 |
| 4,924,144 | 5/1990 | Menn et al. | 313/505 |
| 5,047,687 | 9/1991 | VanSlyke | 313/503 |
| 5,059,862 | 10/1991 | VanSlyke et al. | 313/503 |
| 5,073,446 | 12/1991 | Scozzafava et al. | 428/323 |
| 5,276,380 | 1/1994 | Tang | 313/504 |
| 5,294,869 | 3/1994 | Tang et al. | 313/504 |
| 5,294,870 | 3/1994 | Tang et al. | 313/504 |
| 5,302,468 | 4/1994 | Namiki et al. | 428/690 |
| 5,306,572 | 4/1994 | Ohashi et al. | 428/690 |
| 5,317,169 | 5/1994 | Nakano et al. | 257/40 |
| 5,374,489 | 12/1994 | Imai et al. | 428/690 |
| 5,405,709 | 4/1995 | Littman et al. | 428/690 |
| 5,508,585 | 4/1996 | Butt | 313/509 |
| 5,660,573 | 8/1997 | Butt | 445/24 |

FOREIGN PATENT DOCUMENTS

| | | | |
|---|---|---|---|
| 0 643 118 A1 | 3/1995 | European Pat. Off. | C09K 11/06 |
| 03-250583 | 11/1991 | Japan | H05B 33/22 |
| 97-330390 | 11/1995 | Netherlands Antilles . | |
| WO 96 08026 | 3/1996 | WIPO | H01J 1/62 |

OTHER PUBLICATIONS

C.W. Tang et al., "Electroluminescence of Doped Organic Thin Films", J. Appl. Phys., vol. 65, No. 9, May 1, 1989, pp. 3610–3616.
P. Yam., "Plastics get Wired", Scientific American, Jul. 1995, pp. 83–87.
Y. Yang et al., "Enhanced Performance of Polymer Light–Emitting Diodes Using High–Surface Area Polyaniline Network Electrodes", J. Appl. Phys., vol. 77, No. 2, Jan. 15, 1995, pp. 694–698.
Y. Cao., "Solution–Cast Films of Polyaniline: Optical–Quality Transparent Electrodes", Appl. Phys. Lett., vol. 60, No. 22, Jun. 1, 1992, pp. 2711–2713.
Y. Yang et al., "Polyaniline as a Transparent Electrode for Polymer Light–Emitting Diodes: Lower Operating Voltage and Higher Efficiency", Appl. Phys. Lett., vol. 64, No. 10, Mar. 7, 1994, pp. 1245–1247.
C. Adachi et al., "Molecular Design of Hole Transport Materials for Obtaining High Durability in Organic Electroluminescent Diodes", Appl. Phys. Lett., vol. 66, No. 20, May 15, 1995, pp. 2679–2681.
Y. Cao et al., "Counter–Ion Induced Processibility of Conducting Polyaniline and of Conducting Polyblends of Polyaniline in Bulk Polymers", Synthetic Metals, vol. 48, 1992, pp. 91–97.

*Primary Examiner*—Charles Nold

[57] ABSTRACT

This disclosure provides an electroluminescent ("EL") display device having anode, cathode, insulator and organic EL layers. The anode and cathode layers sandwich the other two layers, and the insulator layer is patterned to selectively block flow of current through the EL layers, and thereby locally block generation of light. The patterned insulator layer allows a single panel to display multiple visual attributes, yet does not require electrode patterning. The patterned insulator can be fabricated using photoresist exposure and development procedures. The photoresist is laid on top of a commercially available substrate/electrode layered pair, and is developed to create an assembly that can be completed in a single vacuum deposition process. By etching a small region of the electrode from the commercially available layered pair, and by choosing a deposition frame that blocks deposition on a second, different small region, electrical terminals may be coupled to the panel with a reduced risk of an electrical short.

24 Claims, 7 Drawing Sheets

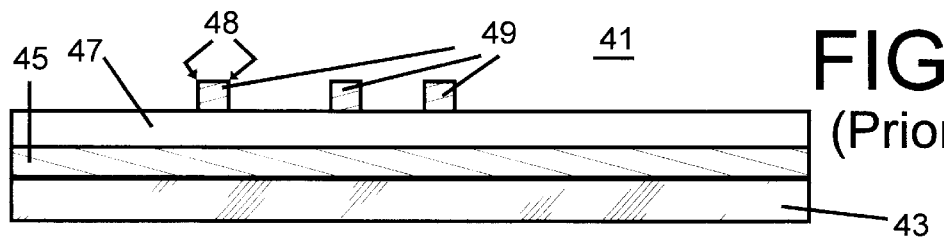
FIG. 1A (Prior Art)
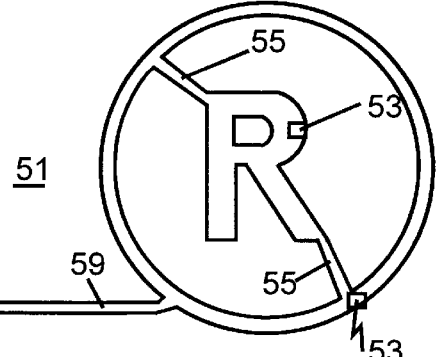
FIG. 1B (Prior Art)
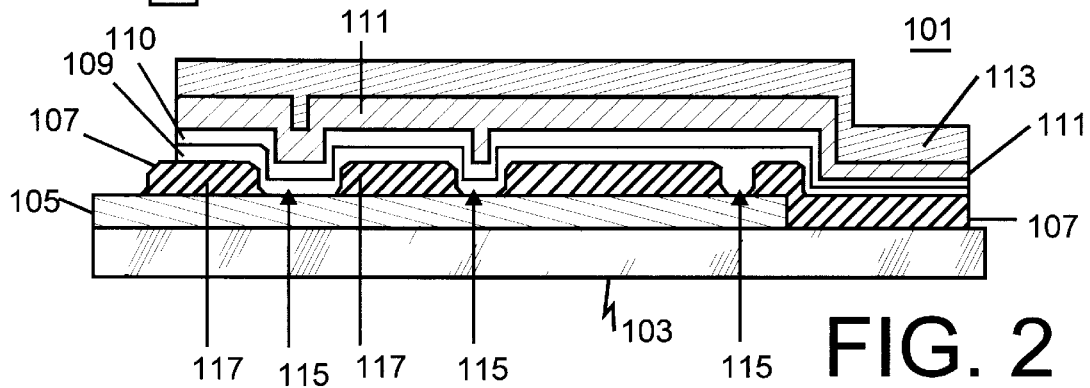
FIG. 2
FIG. 3
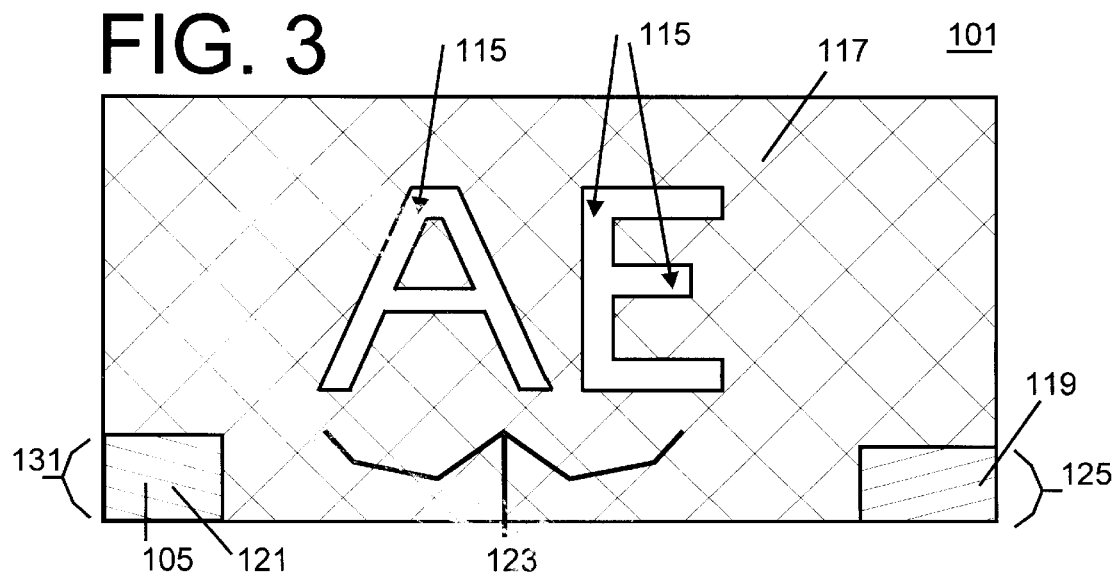

ELECTROLUMINESCENT DISPLAY DEVICE

The present invention relates to an electroluminescent display device.

BACKGROUND

Electroluminescent ("EL") display devices are becoming increasingly popular, due in-part to cheaper fabrication and longer life provided by improvements in thin-film technology. Typically, the EL devices are formed of a number of transparent layers, including an EL layer which generates light when electricity flows through it. In addition to the EL layer, the devices also generally include a substrate and two electrodes (a cathode and an anode) on top of the substrate, with the EL layer situated between the electrodes. The EL layer can be formed from either inorganic or organic EL materials, each having its own chemistries, fabrication procedures, advantages and disadvantages.

As with other electronic display devices, EL devices can be made to be static or addressable. In the former case, a "static" EL device has a single display element which is turned "on" to display one image only; the image can be complex, meaning that it contains many visual attributes, but it is always turned "on" or "off" as a single unit, e.g., as a single pixel. In the latter case, an addressable EL device can include many rows and columns of single-pixel display elements, each of which typically represents a single visual attribute, and can be selectively controlled and illuminated so that the pixels collectively reproduce any desired image. EL devices of the latter type have drawbacks, however; often, it is difficult to fabricate or electrically connect the multiple rows and columns of display elements in a manner that they are close together and provide high resolution. Since many individual display elements usually make-up the display, brightness can vary widely between elements over time, since some pixels tend to be illuminated more frequently than others. Finally, it is expensive to fabricate these types of EL devices.

For these reasons, and due to relative simplicity of construction of a single element which unchangingly represents a complex image, static EL devices are sometimes best suited for use in many applications. As used herein, term "pixel" will be used to refer to the smallest addressable part of a display that can independently be switched "on" and "off." This disclosure relates to a static EL display element, that is, to a single pixel EL device which represents a complex image, having many visual attributes.

FIGS. 1A and 1B illustrate one prior art static device that displays an arbitrary image consisting of the re-entrant alphanumeric character "®." In particular, FIG. 1A shows a cross-section of a display device 41 which includes multiple thin-film layers, including a substrate 43, a first electrode 45, an EL layer 47 and a second electrode 49. The character "®," seen in FIG. 1B, is formed by patterning one of the electrodes 45 or 49, to have the shape of the character; in this manner, when the display is turned "on," electric current will flow through the EL layer 47 and generate light, but only in areas between the two electrodes 45 and 49, to illuminate the character "®."

In FIG. 1B, an electrode 51 is patterned during fabrication to represent multiple visual attributes of the desired image. Since the attributes are part of a single pixel display, each portion 53 of the image which is to be illuminated must overlie the electrode 51 and have a continuous electrical path to a terminal 57; for this reason, the electrode layer 51 is typically patterned in a manner that it is continuous across all of the illuminated portions 53 of the image; the electrode 51 connects them (a) together via a bridge 55 and (b) to the terminal 57 via a connecting path 59.

Again with reference to FIG. 1A, the particular one of the electrodes which is patterned (in the form of electrode 51) can be chosen to be either the first electrode layer 45 or the second electrode layer 49; in FIG. 1A, it is indicated to be the second electrode layer 45. Which ever electrode layer is chosen, patterning results in a display where undesired portions of the conductor, e.g., the bridge 55 and connecting path 59 of FIG. 1B, are necessarily always illuminated along with the character "®" when the display device is switched "on." That is to say, the connecting bridges and paths of an image typically can not be eliminated from the display.

Selecting the first electrode layer 45 for patterning (the one closest to the substrate 43) typically requires a shadow mask or chemical etch procedure, which must be designed to provide a continuous electrode path, including the bridge 55 and connecting path 59. Since a patterned metal layer formed by a chemical etch or shadow mask procedure may tend to have sharp corners (not shown in the context of a first, patterned electrode layer, but designated 48 with respect to the second electrode layer 49 of FIG. 1A), use of a patterned first electrode layer 45 poses heightened device reliability problems (due to possible electrical shorting between electrodes 45 and 49) and requires special attention with respect to thickness and uniformity of the EL layer 47.

On the other hand, if the second, top electrode layer 49 of FIG. 1A is to be patterned, then this is typically performed during, or intermittent to, a vacuum deposition process of the EL layer 47 and the second electrode layer 49, since a shadow mask must be maneuvered into the deposition path. Practically speaking, insertion of a shadow mask is typically performed by interrupting a vacuum deposition process to insert the mask over the device 41 following deposition of the EL layer 47. Since individual thin film layers of the display device may also react adversely with air (forming undesired oxides), patterning of a second electrode layer generally also adds to complication, delay and expense of fabrication of the EL device, and detracts from its useful life. Also, as indicated in FIG. 1A, a patterned second electrode layer 49 typically leaves the EL layer exposed to air, and the second electrode layer 49 susceptible to water denigration by lateral seepage. The design factors just described also detract from large scale parallel device fabrication (using mass chip fabrication technologies, for example). For these reasons, conventional electrode patterning techniques present some significant drawbacks.

A definite need exists for a single element EL device which may be used to represent multiple attributes, yet which does not feature undesired illumination of conductor paths. Still further, a need exists for an EL device which may be used to present a smooth display with a very high level of resolution. Ideally, for example, such an EL device could be used to display photographic images. A need also exists for a means of creating a display which does not require interruption of a vacuum during the fabrication process, and hence, which is a simpler, more reliable process, and which features better economies of scale for simultaneous, parallel device fabrication. Finally, a need exists for a simpler, less expensive fabrication procedure. The present invention solves these needs and provides further, related advantages.

SUMMARY

The present invention solves the aforementioned needs by providing an EL device and related method that does not require electrode patterning; rather, the device makes use of an insulator which is readily patterned to represent any desired image, including photographic or computer images. The patterned insulator locally blocks the flow of current within the device, to thereby block light generation, hence highly intricate electrode patterning is not needed to create a specific image. The present invention enables creation of a display that does not require conductive bridges or paths which are illuminated along with the desired image; it provides for a more accurate, detailed image at nearly any level of resolution.

Moreover, since the present invention does not require electrode patterning, it provides for device manufacture that (1) does not require vacuum interruption and a large number of processing steps, and hence is more easily and less expensively performed, and (2) is more amenable to simultaneous, parallel device manufacture using conventional film deposition techniques. As can be seen, therefore, the present invention provides an EL device that produces better images and is easier to fabricate.

One form of the present invention provides an EL device having a cathode and an anode that together sandwich EL material between them, and a patterned insulator, deposited between the EL material and one of the cathode and the anode. The insulator is employed to impart varied electrical insulation between the cathode and the anode at different regions of the display. Thus, the insulator helps form and distinguish conductive regions of the display, where current may flow through the EL material, and thereby generate light, and impeded regions of the display, which block current, and thereby retard light generation. Utilizing this construction, the EL device of the present invention facilitates use of a continuous, uninterrupted vacuum deposition process to deposit metal electrode layers of the device.

In more detailed aspects of this form of the invention, the EL device is constructed to have at least three regions: one region having anode material, but no cathode material; one region having cathode material, but no anode material; and one region having cathode material and anode material and EL material. This construction permits terminal fabrication without danger of breaking through layers, and thereby unintentionally shorting the display during device fabrication.

Also, in other more detailed features of the invention, the insulator can be formed with a simple photoresist material and a computer printout on transparency, for use as a photoresist mask. In this manner, and with the cooperation of suitable image software, nearly any image, including photographic images, may be used to pattern the undeveloped photoresist into the developed, patterned insulator.

A second form of the invention relates to a method of fabricating an EL device having various ones of the features just described. In the preferred implementation of this second form of the invention, a prefabricated assembly, including a substrate, one electrode (the anode or cathode) and a patterned insulator can be created in a first process, prior to a second process which includes vacuum deposition of the remaining EL device layers atop the prefabricated assembly. In forming the prefabricated assembly, a portion of the first electrode is preferably removed to fabricate a first region which, once completed, will have second electrode material (but no first electrode material). The patterned insulator is also added during this formation process, by any one of a number of procedures. Once the prefabricated assembly has been created, it can be covered with a suitable frame (a mask used for the vacuum deposition process, not to be confused with a photoresist mask preferably used to pattern the insulator), and the EL material, second electrode material and an anti-oxidation cap can be added in a single vacuum process. The frame is selected to have a geometry that blocks deposition of the second electrode material (and preferably, it also blocks deposition of the EL material and cap layers) in a small, second region of the display which is different from the first region. In this second region, the display will have exposed first electrode material, but no second electrode material. The second region is used for a second electrical terminal.

The invention may be better understood by referring to the following detailed description, which should be read in conjunction with the accompanying drawings. The detailed description of a particular preferred embodiment, set out below to enable one to build and use one particular implementation of the invention, is not intended to limit the enumerated claims, but to serve as a particular example thereof.

BRIEF DESCRIPTION OF THE DRAWINGS

FIG. 1A is a cross-section of a prior art electroluminescent ("EL") display device.

FIG. 1B is an illustrative diagram of one layer of a device of FIG. 1A and, in particular, indicates the appearance of a metal electrode used to form the re-entrant alphanumeric character "®," as well as appearance of the device when illuminated.

FIG. 2 is an illustrative cross-sectional diagram of an organic EL panel made according to the principles of the present invention and, in particular, is used to illustrate the different thin-film layers of the panel.

FIG. 3 is a top illustrative view of a finished EL panel made according to the principles of the present invention, used to display an image consisting of the alphanumeric characters "A" and "E."

DETAILED DESCRIPTION

Figure 4:
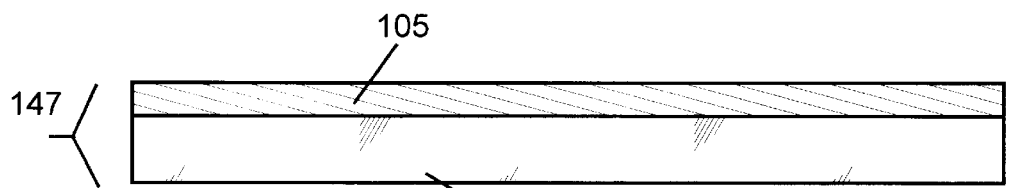
FIG. 4 is a cross-section of a sheet having substrate and conductor layers; the sheet is preferably commercially purchased and forms the starting point for building the preferred EL panel.
Figure 5:
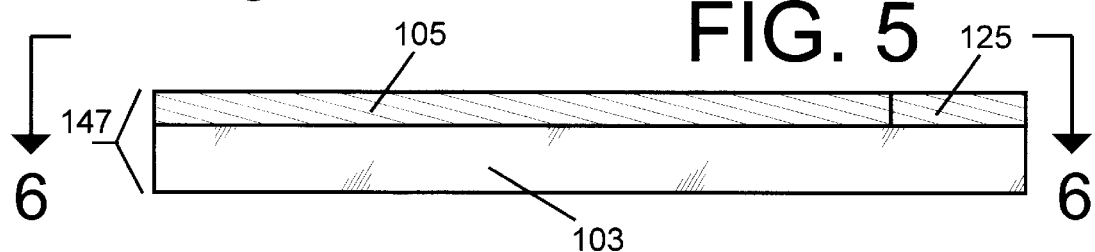
FIG. 5 shows the sheet of FIG. 4, having the conductive layer removed in a small corner of the panel to expose substrate.
Figure 6:
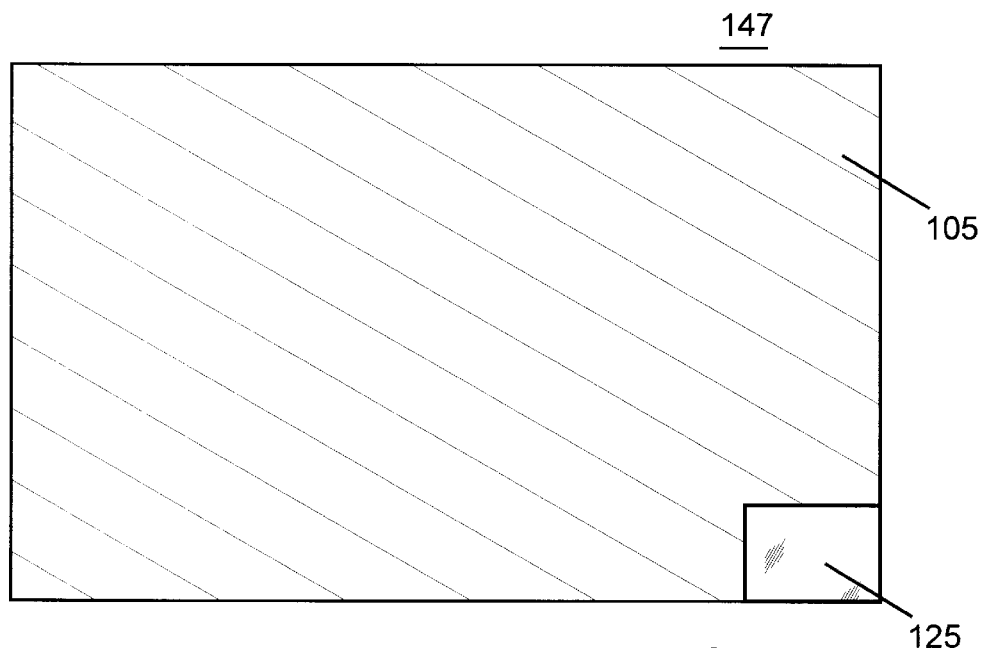
FIG. 6 shows the panel of FIG. 5, taken along lines 6—6 of FIG. 5.

The invention summarized above and defined by the enumerated claims may be better understood by referring to the following detailed description, which should be read in conjunction with the accompanying drawings. This detailed description of a particular preferred embodiment, set out below to enable one to build and use one particular implementation of the invention, is not intended to limit the enumerated claims, but to serve as a particular example thereof. The particular example set out below is the preferred specific implementation of an electroluminescent ("EL") display device, namely, an organic EL display device having a patterned insulator. The invention, however, may also be applied to other types of systems as well, including inorganic devices.

I. Introduction to the Principal Parts.

In accordance with the principles of the present invention, the preferred embodiment is an organic EL display device and procedure for fabricating that device. In particular, the device is used to display an image using a single large pixel EL display element (or "panel") that represents multiple visual attributes; alternatively, a composite image can be formed using multiple, tiled panels, each of which represents multiple visual attributes. Each panel has an insulator layer which permits varied illumination, such that the panel represents a plurality of commonly-controlled visual attributes.

With reference to FIG. 2, the preferred panel 101 includes a plurality of thin-film layers (105, 107, 109 and 111) which are arranged upon a supporting substrate 103. These layers will first be briefly introduced prior to describing the preferred fabrication process.

The substrate 103 is purchased from a commercial source, preferably with a 500-to-3000 Angstrom-thick layer of indium tin oxide ("ITO") 105 already sputtered onto the substrate. It is this layer 105 of ITO which will form a first electrode (the anode) used to provide a current path for illuminating the EL panel 101. As will be described below, this commercially-purchased combination is then processed to add: (1) a patterned insulator 107, which is preferably created using a commercially available photoresist ("AZ 1512," made by Hoechst Celanese); (2) two organic EL material layers 109 and 110, (including a hole transport layer 109 and electron transport layer 110, respectively); (3) a second electrode 111 (preferably, magnesium), which is vacuum-deposited on top of the organic EL material layers to form a cathode; and (4) a cap layer 113 of silver, which is deposited in the same vacuum as the magnesium (to cap the magnesium, which is typically air-sensitive).

The preferred patterned insulator layer 107 is implemented as a photoresist that is exposed and developed to provide to any desired image. As a result, the insulator layer 107 will, when developed, have a pattern of electrical insulation where current (a) in some areas 115 is relatively unimpeded (and thus, the current is permitted to locally pass through the EL material layers 109 and generate light), and (b) in other areas 117 is relatively impeded, and thus, which inhibits local generation of light. In the particular example of FIG. 2, the areas 115 and 117 are indicated to have either no insulation and full insulation, respectively, corresponding to maximum light generation from the EL layers 109 and 110, and no luminescence; preferably, different gray scale levels may be produced by half-toning procedures; however, it is to be understood that varied levels of insulation can also be provided using suitable patterning procedures, to cause luminescence between these extremes.

FIG. 3 provides an illustrative display of the alphanumeric characters "A" and "E." In this example, regions within the boundaries of the characters "A" and "E" correspond to areas 115 having no insulation, and these areas will luminesce when a voltage is coupled across terminal regions 119 and 121. By contrast, the remainder of the display features a relatively thick layer of insulation between the electrodes, and no light is generated in those areas. The hypothetical display image of characters "A" and "E" will be referenced in the remainder of figures discussed by this disclosure.

The preferred method of exposing the photoresist (to display characters "A" and "E") uses a transparency having a computer image printed on it; since present day computer image processing abilities are sufficiently sophisticated to manipulate and print image of nearly any resolution, including photographic images, the preferred method is used to develop a photoresist mask representing nearly any desired image, no matter how complex. The photoresist is preferably added atop the ITO layer 105 (FIG. 2) in an initial processing step, prior to vacuum deposition of the remaining layers 109, 110, 111 and 113. Once the photoresist has been exposed using the photoresist mask and subsequently developed, a prefabricated assembly is formed which is adapted to single-vacuum completion of the panel 101. In this manner, with image patterning already achieved, completion of the EL device can occur without intricate etching and cleaning operations which might be required were it necessary to interrupt a vacuum to pattern the cathode 111.

Figure 15:
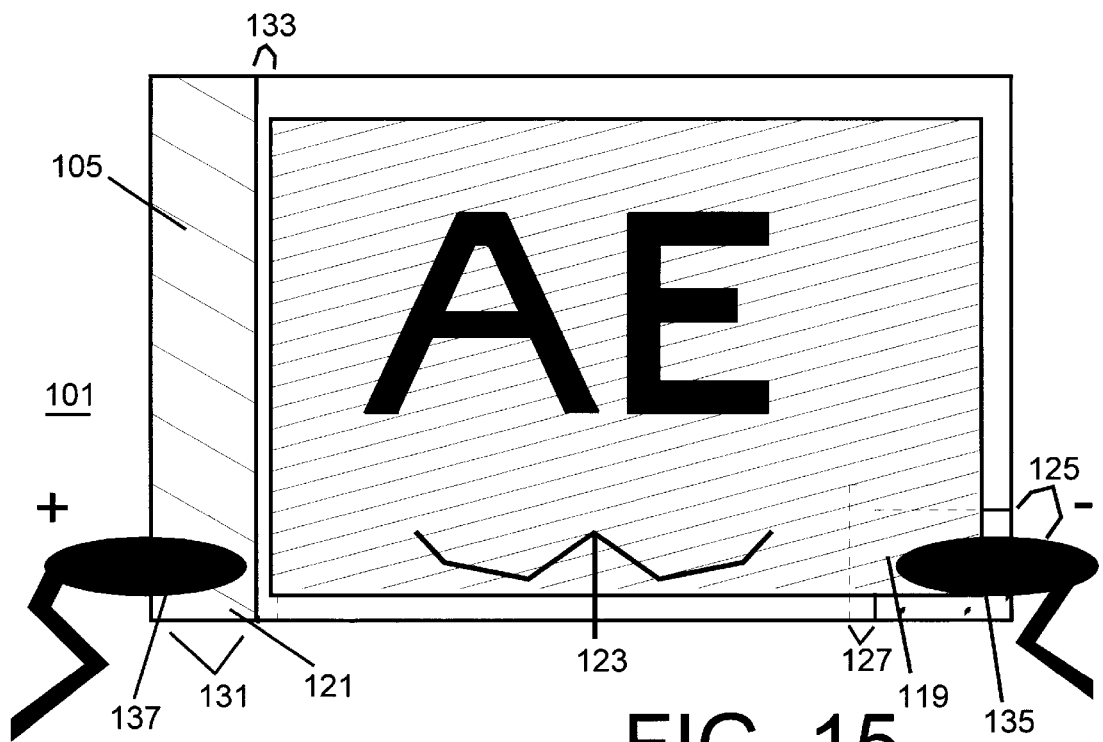
FIG. 15 shows the EL panel of FIG. 14 with positive and negative terminals attached to first and second regions of the display.

With reference to FIG. 15, another feature of the preferred EL panel 101 is the fabrication of three regions 119, 121 and 123 of the device, including (1) a first terminal region 119 that will serve as an electrical terminal for the cathode, (2) a second terminal region 121 that will serve as an electrical terminal for the anode, and (3) a third region 123 where the desired image display is to be formed.

The first region 119 is formed by first defining an area that is sufficiently large to serve as an electrical terminal connection (for example, by selecting an area for coupling to electrical conducting clips). From this region only, the ITO layer is removed to expose a small corner 125 of the substrate. During addition of, and exposure of the photoresist, a border region 127 (FIG. 15) of insulation is formed that overlies and insulates at least a small periphery of the ITO/exposed substrate interface. During vacuum deposition upon the prefabricated assembly to add the organic EL, cathode and cap layers, a deposition frame (not seen in FIG. 15) is chosen such that these layers are deposited over the small corner 125 of the substrate. Upon completion, this first region 119 will include organic EL, magnesium and silver all overlying the substrate, but not include any underlying ITO. Consequently, when an electrical terminal is connected to the region 119, there is little danger of breaking through unintentionally shorting the panel 101 by breaking through the organic EL and insulator layers.

The second region 121 conversely includes an exposed ITO layer 105, but has no cathode or cap layer. This configuration also reduces the likelihood of unintentionally shorting the panel during connection of a second electrical terminal. In forming the second region 121, a second small area 131 or corner is chosen that will also be suitable for connection of a second electrical terminal such as via an electrical conducting clip. Care is taken to ensure that the photoresist layer is not added to completely overlie this area, but rather, to leave the ITO layer 105 exposed within the second small area 131. In addition, during the vacuum deposition, care is also taken to (1) choose a deposition frame and place it such that the organic EL, cathode and cap layers do not overlie the second small area 131, and (2) leave a suitable border 133 of photoresist material that buffers the interface of the ITO layer 105 and the organic EL, cathode and cap layers.

Finally, a third region 123 is also created for display of the desired image, e.g., the alphanumeric characters "A" and "E;" this third region features all of the organic EL materials, and both anode and cathode in overlapping relationship (with the patterned insulator used to differentiate different visual attributes). FIG. 15 shows the panel 101 of FIG. 3 with clips 135 and 137 coupled to the first two regions 119 and 121, to cause the third region 123 to luminesce. Notably, as seen in FIG. 15, there are no connecting bridges or other undesired paths which are illuminated; rather, the image formed is exactly the image desired, e.g., the alphanumeric characters "A" and "E" alone.

II. Fabrication of the EL Panel's Layers.

The process of forming an EL panel will now be described in greater detail, with reference to FIGS. 4–15, which indicate the processing of the panel from purchase of a commercial substrate/ITO package 147 (FIG. 4) to the preferred, finished panel 101 (FIG. 15). As mentioned earlier, the preferred fabrication process includes development of a prefabricated assembly 139 (FIGS. 7–8), and subsequently, a single vacuum deposition process which utilizes a suitable deposition frame 141 selected and placed to facilitate development of first and second terminal regions 119 and 121 (FIG. 15).

The preferred fabrication procedure utilizes a commercially purchased substrate/ITO package 147, indicated in FIG. 4. As mentioned earlier, the ITO layer 105 has preferably already been added to the substrate 103 (which is formed of glass, approximately one millimeter thick) at the time of purchase via a standard sputtering process. Preliminarily, the package 147 is cut or shaped from a sheet of material to be approximately two-by-three inches in width and length (as suitable for use in standard wafer deposition equipment). Subsequently, the package 147 is processed to develop the prefabricated assembly 139 (FIGS. 7 and 8) by first chemically etching the ITO layer 105 to expose the small corner 125 of the substrate, and then, by adding, exposing and developing a photoresist layer 151.

Prior to adding the photoresist layer 151, the package 147 (FIGS. 5 and 6) is cleaned to ensure a smooth adherence of the photoresist layer to the ITO layer 105. First, the package 147 is immersed in an ultrasonic bath which includes a mixture of "Acacianox" and deionized, distilled water. Following the ultrasonic bath, the package 147 is rinsed in successive five minute baths of deionized, distilled water, acetone and isopropyl alcohol. The package 147 is dried using dry nitrogen and a baking procedure of one-hundred-and-thirty degrees Celsius for approximately ten minutes.

Following the cleaning procedure, the photoresist material 151 is added to create a uniform 0.5-to-10 micron layer by spin coating the ITO layer 105 to overlie all portions of the package 147. Preferably, the spin coating procedure utilizes a spin rate of about 3000-to 6000-rotations per minute and a duration of less than one minute, depending upon the desired deposition rate.

Figure 7:
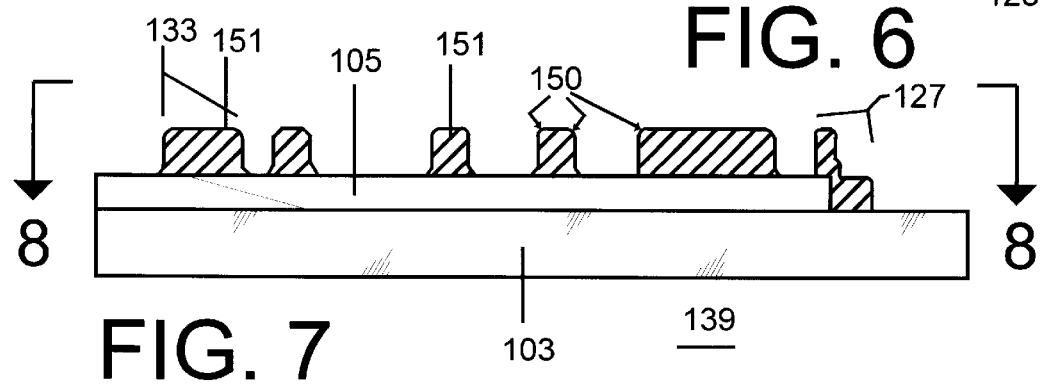
FIG. 7 shows the panel of FIG. 5 and a patterned insulator layer which has been deposited on top of the layers seen in FIG. 5 (to form alphanumeric characters "A" and "E" as seen in FIG. 8) to thereby form a prefabricated assembly.

Importantly, the photoresist layer 151 is employed as an insulator material because it is easily exposed to a predetermined image and then developed into a patterned electrical insulator. Exposure and development of a photoresist layer 151 is the preferred method of patterning, but there are other materials which may be used to develop a patterned insulator; for example, acceptable methods would include use of a pre-patterned adhesive insulator or a chemically-etched insulator. Other types of insulators or patterning methods will occur to those of ordinary skill in the art. Deposition of a photoresist layer 151 is especially useful, however, because a laser printer (not seen in FIGS. 4–15) can be conveniently used to create a photomask via printing upon a transparency, thereby relying on the image processing abilities of many of today's image processing computers (including the ability to accept photographs and generate complex computer images). This photomask production step using a laser printer does not give perfect results, but is a low-cost, practical approach to developing an intricate display image. When the photoresist is developed, the resultant patterned insulator layer 107 may also be tailored to have gradual corners 150 as seen in FIG. 7, rather than sharp corners; this advantage facilitates better device reliability with a reduced likelihood of unintended electrical shortage between electrodes. The preferred method of patterning the photoresist, following the spin-coat process, is described further below.

Whichever patterning procedure is utilized, the insulator layer (107, 151) is patterned so as to retard the flow of current through it in proportion to the areas of the desired display that are to be relatively dark. For example, with reference to FIG. 8, since it is desired to illuminate the letters "A" and "E" only, the photoresist layer 107 is patterned to expose the ITO layer in these locations 152 within the characters' boundaries, so that relatively little electrical resistance is provided between the cathode and anode layers (through the EL materials) at these locations.

Figure 8:
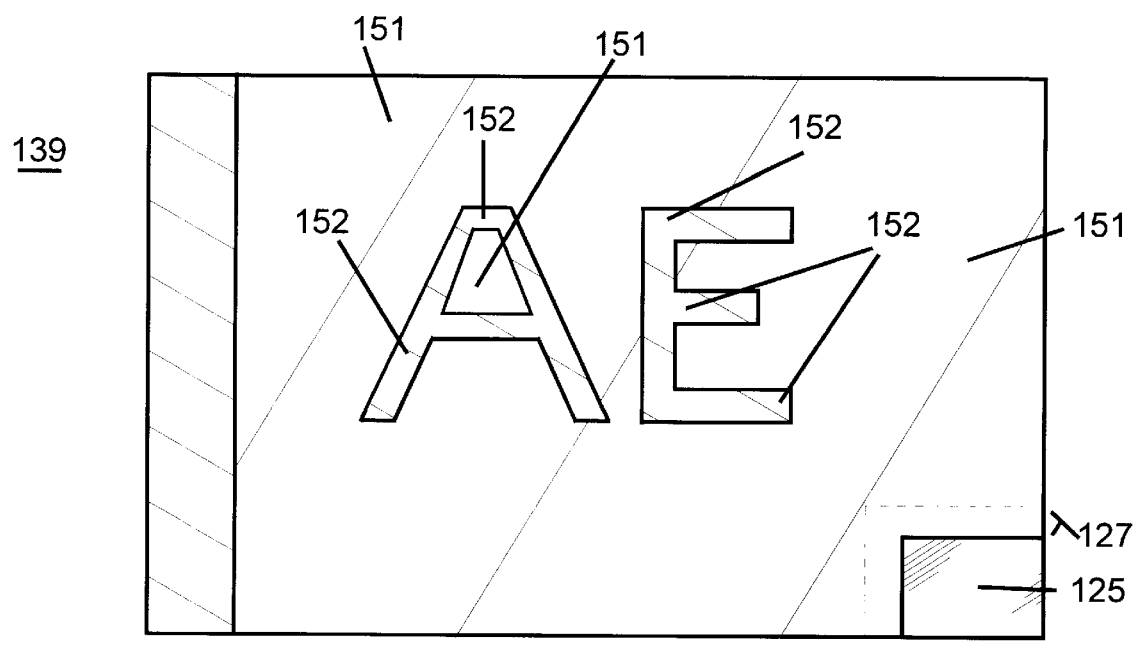
FIG. 8 shows the prefabricated assembly of FIG. 7, taken along lines 8—8 of FIG. 7.

FIGS. 7 and 8 show the prefabricated assembly 139, where all processing prior to a single step vacuum has been performed, and the remaining layers of the EL device can be added without patterning or interrupting the vacuum. As can be seen in these figures, the photoresist layer 151 has been added atop the ITO layer 105 and the substrate 103 to cover all areas except the portions of the display for which it is desired to emit light, namely, as defined by the alphanumeric characters "A" and "E." Within these characters, the ITO layer 105 remains exposed; for purposes of illustration, FIG. 8 shows the small corner 125 to be used for an electrical terminal as exposed, although in practice it may be covered with photoresist material since the cathode will be deposited over the corner 125 in the vacuum deposition process, and it is important only to remove underlying ITO from within the corner 125 to reduce the likelihood of electrical short.

Figure 9:
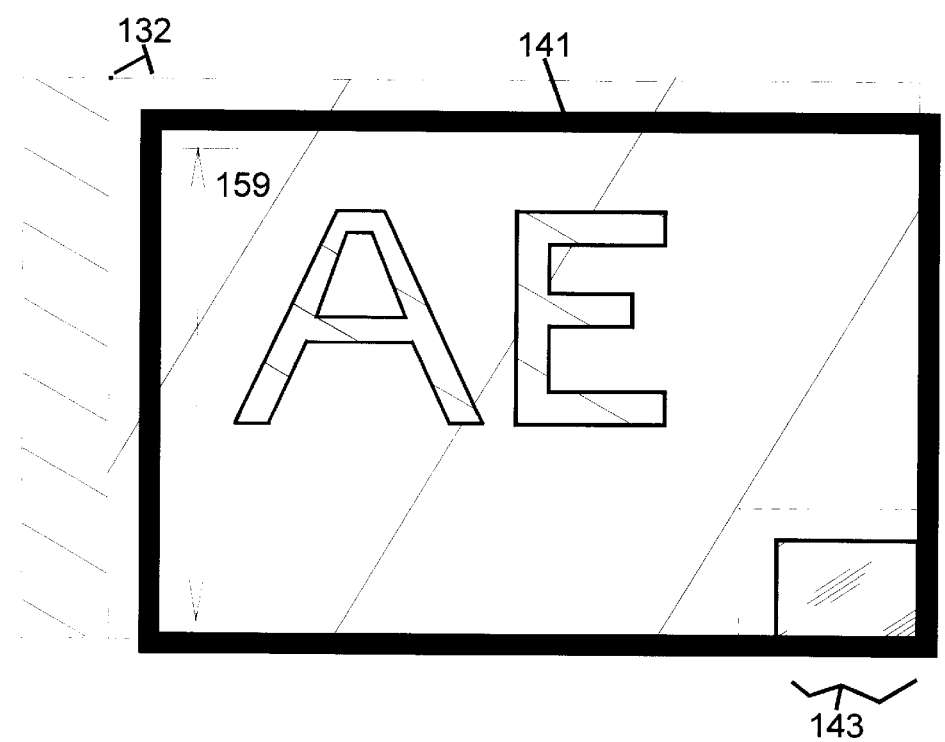
FIG. 9 shows the prefabricated assembly of FIG. 8 as it is fitted with a deposition frame; the frame is added for vacuum deposition of EL materials, magnesium and silver layers, and it limits the region of deposition.

FIGS. 9–14 illustrate deposition of additional layers in a single-vacuum procedure. In FIG. 9, the prefabricated assembly 139 is shown with the deposition frame 141 clamped onto it, thereby defining a deposition area 159 within the frame's boundaries. Although the frame 141 is illustrated by a black rectangle in FIG. 9, with the remainder of the prefabricated assembly 139 outside of the rectangle visible, it is to be understood that the frame completely masks all portions of the panel not indicated within the frame's boundaries. Importantly, the frame 141 is chosen to permit deposition in the first terminal region indicated in the lower-right hand of FIG. 9 by the reference numeral 143 (this area overlaps the small corner 125 to the maximum extent possible).

Figure 10:
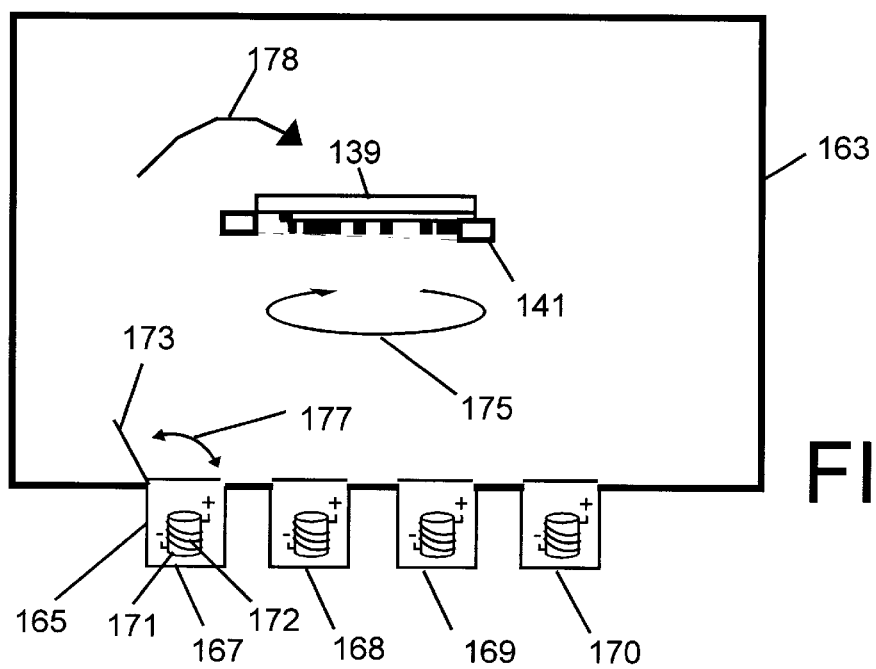
FIG. 10 schematically shows a vacuum deposition chamber with the prefabricated assembly and deposition frame clamped to it.

The prefabricated assembly 139, with the frame 141 clamped onto it, is seen in FIG. 10 to be mounted within a vacuum chamber 163 for vapor deposition, thermal evaporation or other deposition process conventional to thin-film fabrication. As seen in FIG. 10, the preferred method utilizes a thermal evaporation (vapor deposition) source 165 mounted within the chamber 163; four particular sources 167–170 are illustrated, corresponding to each of hole transport EL material, electron transport EL material, cathode material and cap material. Each source 165 includes a crucible 171 and a heated filament 172 which is selectively engaged when source shutters 173 are opened to permit vapor deposition of material within the crucible. As seen in FIG. 10, the prefabricated assembly 139 is continually rotated during deposition to promote uniform layer thickness, as indicated by the arrow 175. A second arrow 177 indicates that individual shutters associated with each source 167–170 are sequentially opened for selective deposition of the appropriate material. Finally, a third arrow 178 is also used to show deposition onto the prefabricated assembly. All of the layers are sequentially deposited without interrupting the vacuum, such that the air sensitive layers (typically, the organic EL and cathode layers) can be sealed.

Figure 11:
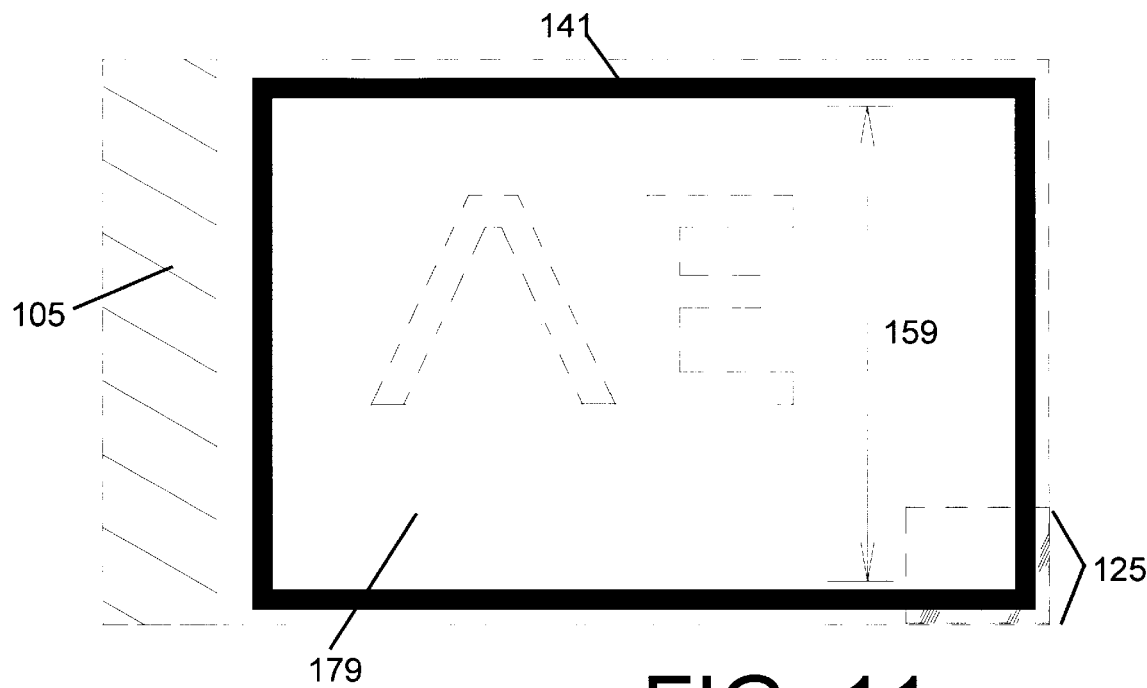
FIG. 11 shows the prefabricated assembly of FIG. 9 and layers of EL materials deposited on top of the prefabricated assembly, within the region defined by the frame.
Figure 12:
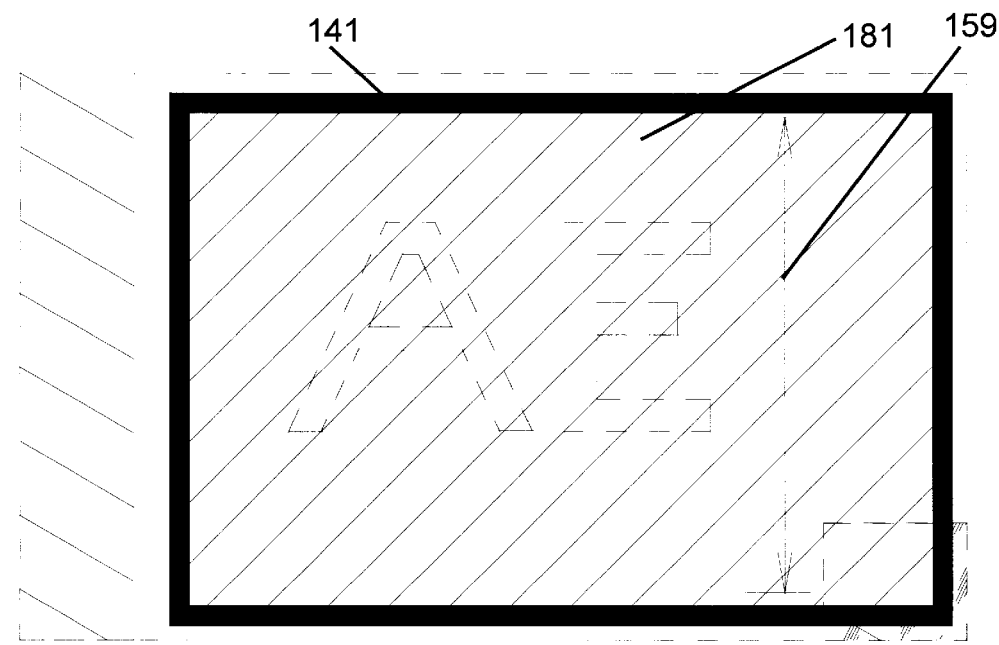
FIG. 12 indicates deposition of a first electrode material (magnesium) on top of the layers of EL materials of FIG. 11, within the region defined by the frame.

As indicated in FIG. 11, the area 159 within the boundaries of the frame 141 is first deposited with two organic EL layers (collectively, 179), namely, the hole transport layer 109 and the electron transport layer 110 (indicated earlier in FIG. 2). Each of these layers is typically six-to-eight hundred Angstroms in thickness. The hole transport layer 109 is preferably formed first, by vapor deposition of N,N'-diphenyl-N-N'-bis(3-methylphenyl)1,1'-biphenyl-4, 4"diamine ("TPD"). Next, the electron transport layer 110 is formed of aluminum trihydroxyquinoline ($Alq_3$), also by vapor deposition. Many different compounds and variations in structure have been used for the different layers and regions in organic electroluminescent devices. Examples of such devices and the specific compounds of which they are made are found in such references as U.S. Pat. No. 4,356, 429 (Tang) issued Oct. 26, 1982; U.S. Pat. No. 4,539,507 (VanSlyke et al.) issued Sep. 3, 1985; U.S. Pat. No. 4,885, 211 (Tang et al.) issued Dec. 5, 1989; U.S. Pat. No. 5,047, 687 (VanSlyke) issued Sep. 10, 1991; U.S. Pat. No. 5,059, 862 (VanSlyke et al.) issued Oct. 22, 1991; and Tang et al., "Electroluminescence of Doped Organic Thin Films", Journal of Applied Physics no. 65(9), May 1, 1989, pages 3610–3616, all of which are incorporated herein by this reference.

Figure 13:
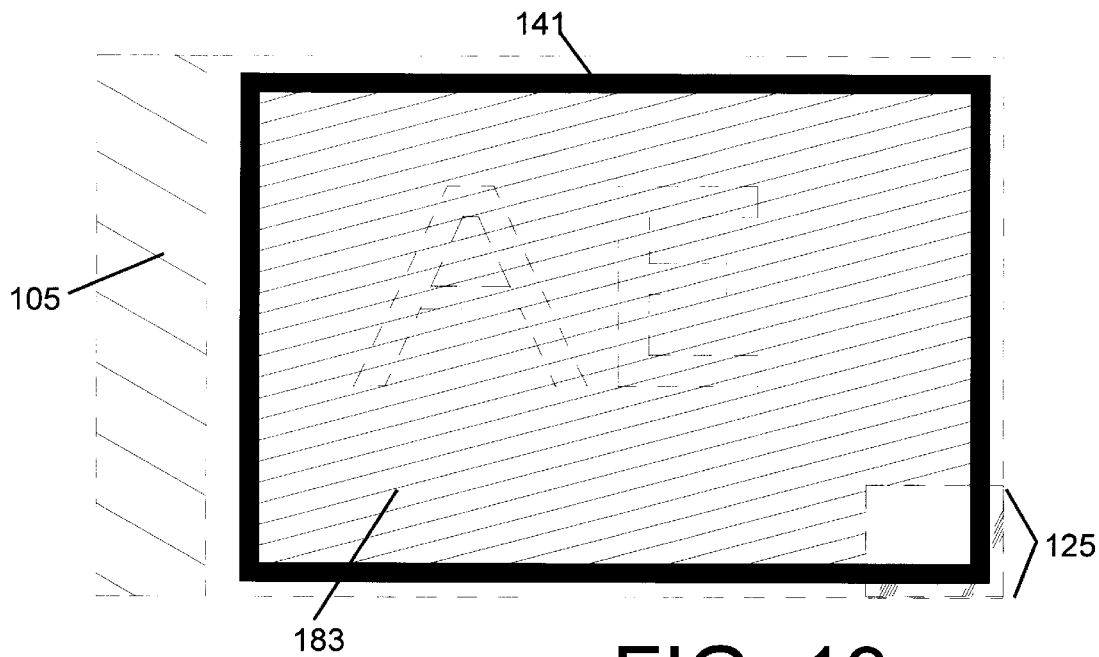
FIG. 13 indicates deposition of a metal cap (silver) on top of the magnesium layer of FIG. 12, within the region defined by the frame, to form a finished EL panel.
Figure 14:
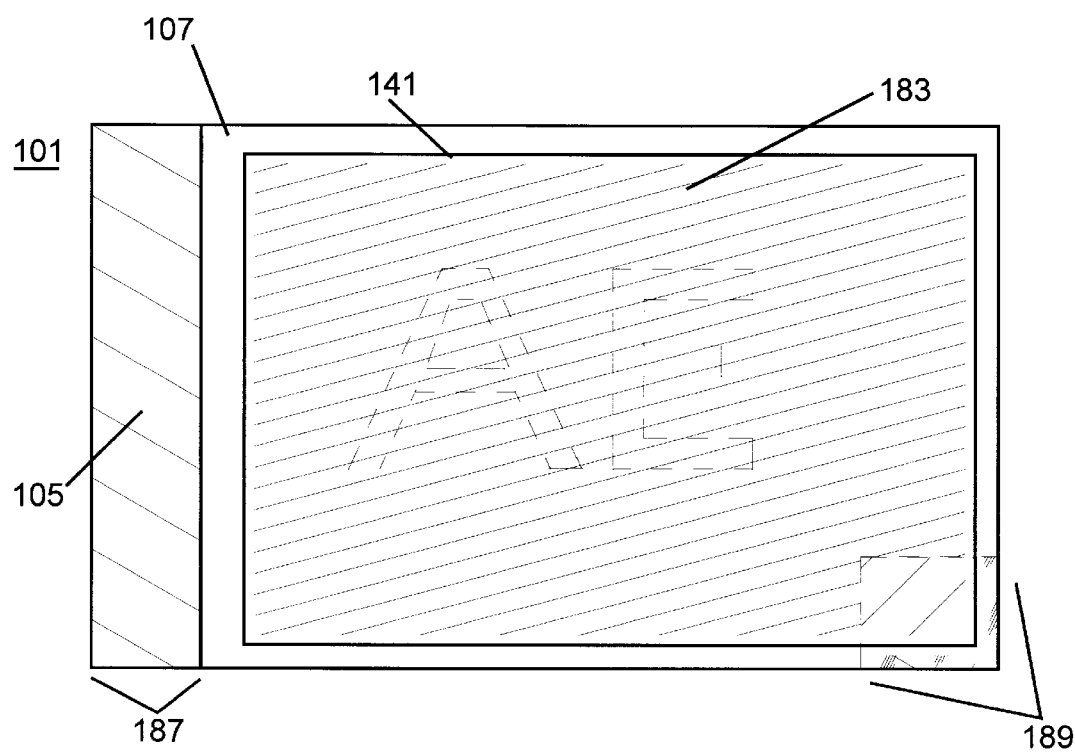
FIG. 14 shows the finished EL panel of FIG. 13, with the frame removed.

Once the organic EL layers 179 are deposited, cathode and cap layers 181 and 183 (FIGS. 12 and 13) are deposited using an evaporation process to complete fabrication of an organic EL panel 101 (FIG. 15). As indicated by angled-line hatching in FIG. 12, the magnesium (cathode) layer 181 is deposited on top of the electron transport layer without interrupting the vacuum, preferably having a thickness of about fifteen-hundred Angstroms. Immediately following this deposition, the layer 183 of silver (or alternatively, aluminum) is deposited to have a thickness of between two-tenths-to-two microns, as indicated by FIG. 13. This final "cap" layer 183 serves to insulate the magnesium layer 181 from air, and to reduce the likelihood that any holes exist in the cathode layer which could be a source for air or water, which might detract from the device's useful life. FIG. 13 indicates addition of the silver layer 183 using a different hatching than was used in connection with FIG. 12, whereas FIG. 14 indicates configuration of the completed EL panel 101 after removal from the vacuum chamber 163 and removal of the deposition frame 141 from the completed panel. In FIG. 14, a left edge 187 of the panel exposes the ITO layer 105, whereas a right lower corner 189 of the panel features exposed silver without ITO lying beneath the silver.

III. Configuration of Electrical Terminals.

Electrical terminals can then be attached as indicated in FIG. 15 to cause the desired display of the alphanumeric characters "A" and "E" to be illuminated at regions which are relatively unimpeded by the patterned insulator layer. The terminals can be as simple as electrical conducting clips 135 and 137, or may be made to be more permanent in nature. Typically, a supply voltage (not seen) of between 2.50-and-15 volts is used to cause illumination of the panel 101, depending upon the thickness of the organic EL layers.

IV. Patterning the Insulator.

A. Use of A Photoresist.

Figure 16:
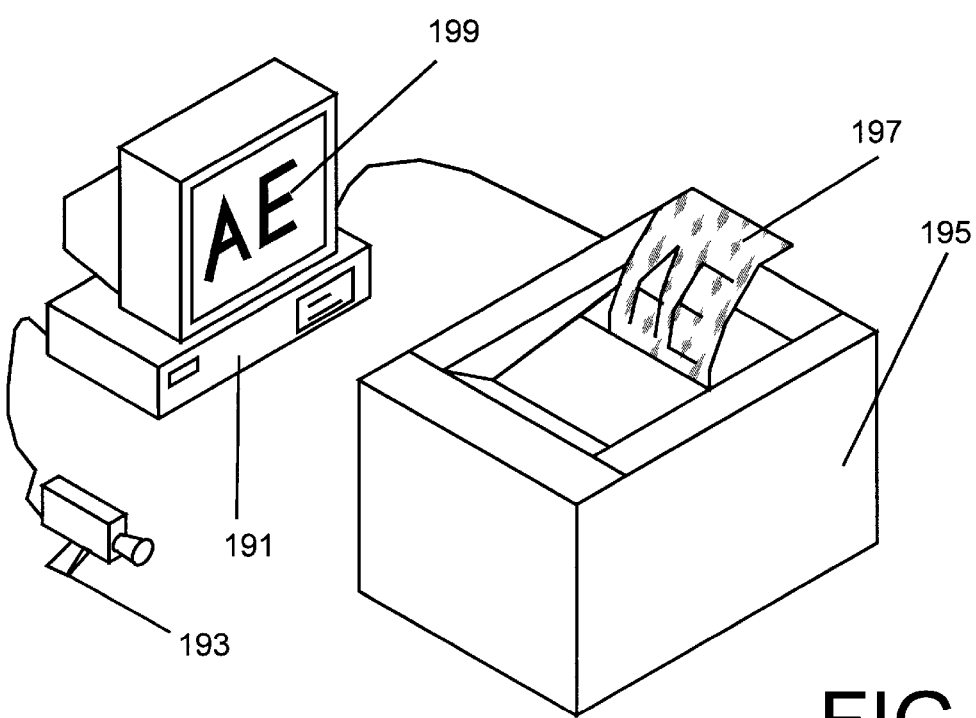
FIG. 16 shows a camera, computer and printer used to create a photoresist mask for patterning the insulator; in the preferred example shown, a simple transparency is generated to be used as a photoresist mask.

In accordance with the principles of the invention, various mechanisms can be used to generate the patterned insulator layer. Preferably, as indicated by FIG. 16, a desired image is generated by a computer 191, or is captured by a video camera 193 which is connected to the computer for image processing and printout. Use of a computer 191 enables creation of masks that utilize highly detailed images, such as digital photographs or other complex images.

A laser printer 195 is then used to print the desired display upon a transparency 197 that will be used to expose the "AZ 1512" positive photoresist material. The laser printer 195 is caused to print only those portions of the transparency 197 which will be illuminated using a positive photoresist. For example, as seen in FIG. 16, a computer image 199 of the alphanumeric characters "A" and "E" is printed upon the transparency 197 such that the letters are black.

Notably, it will readily occur to one of ordinary skill in the art that many different types of masks can be used instead of a transparency. For example, standard photomasks used in integrated circuits, or thermal mask procedures can be used.

Figure 17:
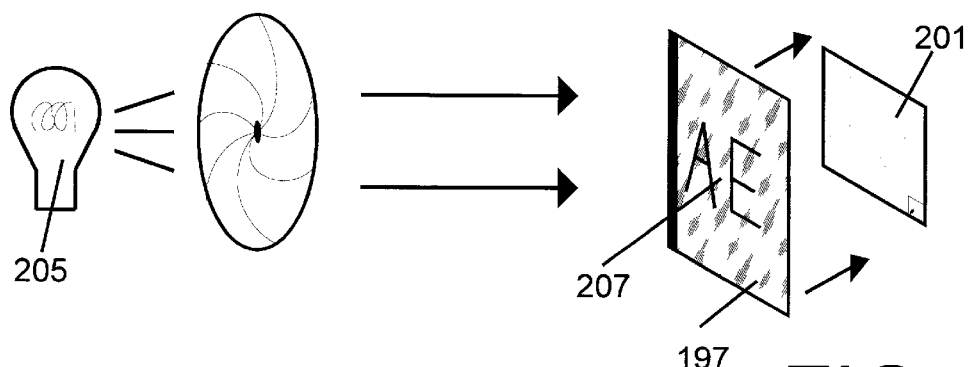
FIG. 17 is a schematic view that indicates (a) adherence of the photoresist mask to the material of FIGS. 5 and 6 (which has been layered with a patternable insulator which is a photoresist) and (b) exposure of the photoresist to form an exposed material.
Figure 18:
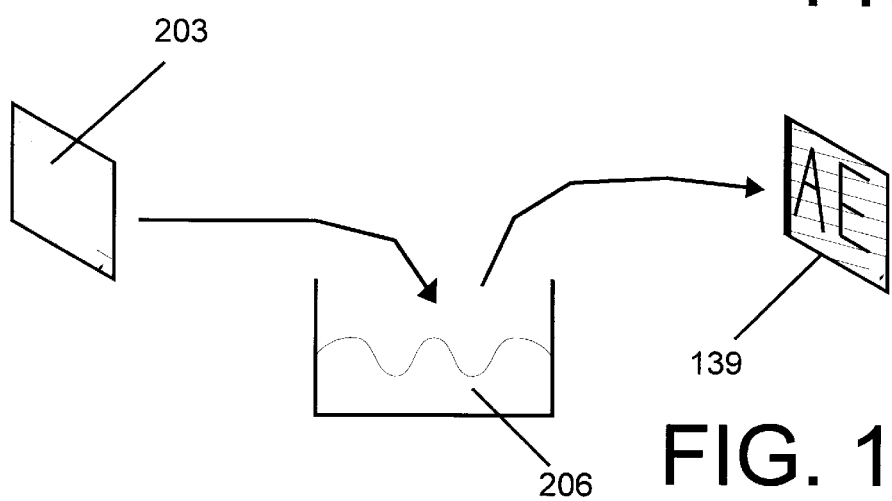
FIG. 18 shows chemical development of the exposed material, whereby the patternable insulator has now been patterned in the form of alphanumeric characters "A" and "E," to form the prefabricated assembly of FIG. 8.

In the case of the preferred photoresist material ("AZ 1512"), exposure and development occurs by first applying a soft bake procedure to the deposited photoresist material (designated by the reference numeral 201 in FIG. 17) of about ninety degrees Celsius for five minutes, and then allowing the material to cool to room temperature. The transparency 197 is then adhered or taped to overlie the photoresist material 201, which is then exposed to an ultraviolet lamp 205 for approximately one minute in a manner that provides for uniform illumination. Following exposure, the transparency 197 is removed and development is performed as indicated by FIG. 18 by immersing the exposed package 203 in a 50/50 bath 206 of developer ("AZ 1512" developer, made by Hoeschst Celanese) and deionized, distilled water for approximately one hour. The package 203 is then washed in running water to removed any undesired photoresist film residuals, to produce the prefabricated assembly 139. The prefabricated assembly 139 is then dried using dry nitrogen and subjected to a bake procedure of one-hundred-and-thirty degrees Celsius for five-to-ten minutes. The prefabricated assembly 139 is then ready for vacuum deposition of the organic EL layer 179 using thermal procedures.

B. Use of Other Patterning Methods.

While use of a photoresist material is the preferred method of patterning the preferred insulator layer 107 of the panel 101 (as indicated by FIG. 3), there are other methods which can be employed as well. For example, a precision-controlled laser (not seen) can be utilized to pattern the insulator layer. Alternatively, a chemical etch process can be utilized where a chemical etch material is deposited as the insulator layer and a suitable mask is patterned on top of the insulator layer. This method is schematically also depicted by FIG. 17, with the letters "A" and "E" 207 representing a chemical mask which has been adhered to an etch material to resist chemical erosion. As indicated by FIG. 18, the composite may then also be developed using an appropriate bath 206, and the mask 207 removed to leave a patterned insulator. Alternatively, other insulators may be used other than a photoresist, for example, a silicon oxide or silicon nitride layer, coupled with suitable patterning procedures. These methods are not the only patterning mechanisms which will occur to those having ordinary skill in the art, and a variety of other patterning procedures may be used to create the patterned insulator layer. In addition, it is within the scope of the present invention to utilize both electrode patterning and use of a patterned insulator.

Having thus described an exemplary embodiment of the invention, it will be apparent that further alterations, modifications, and improvements will also occur to those skilled in the art. Further, it will be apparent that the present invention is not limited to the specific form described. Rather, the preferred display, and the invention in general, may be applied to a wide variety of applications. Various alterations, modifications, and improvements, though not expressly described or mentioned above, are nonetheless intended and implied to be within the spirit and scope of the invention. Accordingly, the foregoing discussion is intended to be illustrative only; the invention is limited and defined only by the various following claims and equivalents thereto.

We claim:

1. An electroluminescent display device having two conductors and an electroluminescent material therebetween, the electroluminescent material adapted to luminesce when electricity flows through it, the improvement comprising:

the first and second conductors and the electroluminescent material layered to form a substantially flat display panel with the electroluminescent material between the conductors, the substantially flat display panel including three regions, including a display region and first and second terminal regions; and a patterned insulator, layered between the first and second conductors, the patterned insulator possessing substantial breaks and continuities within the display region to thereby form a pattern that selectively inhibits electrical flow at predetermined areas of the display region, thereby causing the electroluminescent material to luminesce only at portions of the display region not electrically inhibited by the patterned insulator; and wherein the first electrode is layered such that the first electrode occupies only the display region and the first terminal region, and wherein the second electrode and the electroluminescent material are layered to occupy only the display region and the second terminal region, such that two mutually-exclusive regions are thereby formed outside the display region, each containing one of the first and second electrodes, but not both, such that risk of electrical shortage between layers of the display device is thereby reduced during electrical connection to each of the two mutually-exclusive regions.

2. An improvement according to claim 1, further comprising:

a display region that includes organic electroluminescent material.

3. An improvement according to claim 1, further comprising:

a display region that includes an air-sensitive electrode layer and a cap layer that is deposited atop the display region, to seal the display region from external exposure.

4. An improvement according to claim 1, wherein the electroluminescent material is an organic electroluminescent material.

5. An electroluminescent display device, comprising:

a substrate having first, second and third regions;

an anode layer layered above the substrate to cover the second region and the third region only;

a cathode layer layered above the substrate to cover the first region and the third region only;

an electroluminescent material layered between the anode layer and the cathode layer that covers the third region and one of the first and second regions; and a patterned insulator layered between the anode layer and cathode layer, the patterned insulator possessing substantial breaks and continuities within the display region to thereby form a pattern that selectively inhibits electrical flow at predetermined areas of the display region, thereby causing the electroluminescent material to luminesce only at portions of the display region not electrically inhibited by the patterned insulator.

6. A device according to claim 5, wherein the electroluminescent material and one of the anode layer and the cathode layer are formed by deposition in a common vacuum using a common mask.

7. A device according to claim 5, wherein the electroluminescent material is an organic electroluminescent material.

8. A device according to claim 5, wherein the first region includes an exposed cathode layer, and wherein the second region includes an exposed anode layer, underlying electroluminescent material, and no underlying anode layer.

9. A method of making an electroluminescent display, comprising:

depositing each of a cathode layer and an anode layer;

depositing an electroluminescent material between the cathode layer and the anode layer, the electroluminescent material emitting radiation when current flows through the electroluminescent material between the cathode layer and the anode layer; and forming a patterned insulator layer to thereby create varied electrical insulation between the cathode layer and the anode layer at different regions of said display by depositing a photosensitive material and patterning it by exposing the photosensitive material using an illumination device and an image, and developing the photosensitive material to form a patterned insulator layer, by removing exposed regions of photosensitive material if the photosensitive material is a positive photoresist, and by removing unexposed regions of photosensitive material if the photosensitive material is a negative photoresist;

wherein conductive regions of said display are thereby formed which have relatively high electrical conductivity, and thereby emit relatively greater radiation when current flows between the cathode layer and the anode layer, and impeded regions of said display are thereby also formed, which have relatively low electrical conductivity, and thereby emit relatively less radiation when current flows between the cathode layer and the anode layer.

10. A method of making an electroluminescent display according to claim 9, further comprising:

creating a prefabricated assembly that includes a substrate, one of the cathode layer and the anode layer over the substrate, and a patterned insulator layer over the one of the cathode layer and the anode layer; and depositing in a single vacuum the electroluminescent material over the patterned insulator layer, and the other of the cathode layer and the anode layer over the electroluminescent material.

11. A method of making an electroluminescent display according to claim 10, wherein depositing in a single vacuum includes:

depositing the other of the cathode layer and the anode layer to include both of a first conductor layer that is sensitive to exposure to air; and depositing a second conductor layer over the first conductive layer, the second conductive layer being relatively insensitive to air and substantially sealing the first conductive layer from exposure to air.

12. A method of making an electroluminescent display according to claim 10, wherein depositing in a single vacuum includes:

depositing the electroluminescent material to include both of a hole transport layer and an electron transport layer.

13. A method of making an electroluminescent display according to claim 9, wherein:

depositing the electroluminescent material includes depositing an organic electroluminescent material.

14. A method of making an electroluminescent display according to claim 9, wherein exposing the photosensitive material includes:

placing a mask layer over the photosensitive material, the mask layer patterned to selectively admit and block light at different regions of said display; and illuminating the mask layer with the light to thereby expose selective regions of the photosensitive material.

15. A method of making an electroluminescent display according to claim 14, wherein:

said method further comprises generating the mask layer by using a computer and a laser printer to print an image upon a transparency; and placing the mask layer over the photosensitive material includes placing the transparency and the image printed upon it over the photosensitive material.

16. A method of making an electroluminescent display, comprising:

creating a prefabricated assembly that includes a substrate, one of a cathode layer and the anode layer over the substrate, and a patterned insulator layer over the one of the cathode layer and the anode layer; and depositing in a single vacuum an electroluminescent material layer over the patterned insulator layer, and the other of the cathode layer and the anode layer over the electroluminescent material;

wherein conductive regions of said display are formed (via patterning in the patterned insulator layer) which have relatively high electrical conductivity, and thereby emit relatively greater radiation when current flows between the cathode layer and the anode layer, and impeded regions of said display are also formed (via insulation provided by the patterned insulator layer) which have relatively low electrical conductivity, and thereby emit relatively less radiation when current flows between the cathode layer and the anode layer.

17. A method of making an electroluminescent display according to claim 16, wherein depositing in a single vacuum includes:

depositing the other of the cathode layer and the anode layer to include both of a first conductor layer that is sensitive to exposure to air; and depositing a second conductor layer over the first conductive layer, the second conductive layer being relatively insensitive to air and substantially sealing the first conductive layer from exposure to air.

18. A method of making an electroluminescent display according to claim 16, wherein depositing in a single vacuum includes:

depositing the electroluminescent material to include both of a hole transport layer and an electron transport layer.

19. A method of making an electroluminescent display according to claim 16, wherein:

depositing the electroluminescent material includes depositing an organic electroluminescent material.

20. A method of making an electroluminescent display according to claim 16, wherein depositing an insulator layer includes:

depositing a photosensitive material; and forming a pattern by placing a mask layer over the photosensitive material, the mask layer patterned to selectively admit and block light at different regions of said display; and exposing the photosensitive material to the light, with the mask layer in place, to thereby expose selective regions of the photosensitive material, and developing the photosensitive material to form the patterned insulator layer, by removing exposed regions of photosensitive material if the photosensitive material is a positive photoresist and by removing unexposed regions of photosensitive material if the photosensitive material is a negative photoresist.

21. A method of making an electroluminescent display according to claim 20, wherein:

said method further comprises generating the mask layer by using a computer and a laser printer to print an image upon a transparency; and placing the mask layer over the photosensitive material includes placing the transparency and the image printed upon it over the photosensitive material.

22. A method of making an electroluminescent display according to claim 16, wherein forming a pattern includes:

adhering a mask layer over the insulator layer, the mask layer selected to resist a predetermined etch chemical, and with the mask layer in place, chemically etching the portions of the insulator layer exposed by the mask layer.

23. A method of making an electroluminescent display according to claim 9, wherein the electroluminescent display includes a substrate having at least three regions, and wherein:
  depositing each of the anode layer and the cathode layer includes
    depositing one of the anode layer and the cathode layer over the substrate to cover all but a first one of the three regions, and
    depositing the other of the anode layer and the cathode layer over the substrate to cover all but a second one of the regions; and
  depositing the electroluminescent material includes depositing the electroluminescent material such that it covers the third region, which is overlaid by all three of the anode layer, the cathode layer and the electroluminescent material;
  wherein, after completion of the electroluminescent display,
    the first one of the regions is thereby adapted for use as a first electrical terminal which is not susceptible to electrical shorting via layer damage,
    the second one of the regions is thereby adapted for use as a second electrical terminal which is not susceptible to electrical shorting via layer damage, and
    the third one of the regions is thereby adapted for use in generating radiation when electrical current flows between the first and second electrical terminals.

24. A method of making an electroluminescent display according to claim 23, further comprising:
  creating a prefabricated assembly to include
    one of the cathode layer and the anode layer over the substrate in a manner to cover the first and third ones of the regions, and
    a patterned insulator layer over the substrate in a manner that covers at least the third one of the regions; and
  depositing in a single vacuum with a single mask the electroluminescent material, and the other of the cathode layer and the anode layer, the mask oriented such that the electroluminescent material and the other of the cathode layer and the anode layer cover at least the second and third ones of the regions.

* * * * *